US010481651B2

(12) United States Patent
Dede et al.

(10) Patent No.: US 10,481,651 B2
(45) Date of Patent: Nov. 19, 2019

(54) INTEGRATED PCU AND GPU COOLING SYSTEM

(71) Applicant: TOYOTA MOTOR ENGINEERING & MANUFACTURING NORTH AMERICA, INC., Erlanger, KY (US)

(72) Inventors: Ercan M. Dede, Ann Arbor, MI (US); Jongwon Shin, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/834,173

(22) Filed: Dec. 7, 2017

(65) Prior Publication Data

US 2019/0179381 A1    Jun. 13, 2019

(51) Int. Cl.
*G06F 1/20* (2006.01)
*H05K 7/20* (2006.01)
*G06F 1/26* (2006.01)

(52) U.S. Cl.
CPC .......... *G06F 1/20* (2013.01); *G06F 1/26* (2013.01); *H05K 7/20927* (2013.01); *B60Y 2306/05* (2013.01); *H05K 7/209* (2013.01)

(58) Field of Classification Search
CPC ............... B60Y 2306/05; H05K 7/209
See application file for complete search history.

(56) References Cited

U.S. PATENT DOCUMENTS

| 7,943,955 | B2 * | 5/2011 | Haeberlen ....... H01L 21/823475 |
| | | | 257/124 |
| 8,482,919 | B2 | 7/2013 | Dede |
| 8,700,925 | B2 | 4/2014 | Wyatt |
| 9,069,535 | B2 | 6/2015 | Degner et al. |
| 9,267,743 | B2 | 2/2016 | Sugimoto et al. |
| 9,445,526 | B2 | 9/2016 | Zhou et al. |
| 2004/0218367 | A1 | 11/2004 | Lin et al. |
| 2006/0050483 | A1 * | 3/2006 | Wilson ................. H01L 23/473 |
| | | | 361/702 |
| 2006/0109629 | A1 * | 5/2006 | Harris ................. H01L 23/433 |
| | | | 361/704 |
| 2006/0187646 | A1 * | 8/2006 | Belson ................. H05K 1/141 |
| | | | 361/719 |

(Continued)

OTHER PUBLICATIONS

Osamu Kitazawa, et al., "Development of Power Control Unit for Compact-Class Vehicle", SAE International, J. Alt. Power, vol. 5, Issue 2, Jul. 2016, pp. 278-285.

*Primary Examiner* — Robert J Hoffberg
(74) *Attorney, Agent, or Firm* — Oblon, McClelland, Maier & Neustadt, L.L.P.

(57) ABSTRACT

An electronics control system includes a power control unit disposed above a graphics processing unit and thermally connected to a cooling assembly inside. The system also includes a graphics processing unit disposed below the power control unit and thermally connected to the cooling assembly, an auxiliary DC-DC converter disposed below the power control unit and thermally connected to the cooling assembly, and a cooling assembly disposed at a predetermined location and configured to simultaneously transfer heat away from a power control unit, graphics processing unit, and auxiliary DC-DC converter via fluid circulation are presented.

8 Claims, 4 Drawing Sheets

(56) References Cited

U.S. PATENT DOCUMENTS

| | | | |
|---|---|---|---|
| 2008/0080144 A1* | 4/2008 | Machiroutu | H01L 23/3735 |
| | | | 361/719 |
| 2008/0225490 A1* | 9/2008 | Suh | C22C 13/00 |
| | | | 361/705 |
| 2009/0218078 A1* | 9/2009 | Brunschwiler | G06F 1/20 |
| | | | 165/104.33 |
| 2010/0128436 A1* | 5/2010 | Edmunds | H01L 23/427 |
| | | | 361/700 |
| 2010/0296239 A1* | 11/2010 | Alyaser | F28D 15/00 |
| | | | 361/679.53 |
| 2012/0173732 A1* | 7/2012 | Sullivan | G06F 1/1607 |
| | | | 709/226 |
| 2014/0085829 A1* | 3/2014 | Yamashita | H01L 23/49827 |
| | | | 361/717 |
| 2014/0097060 A1* | 4/2014 | Hoshinoya | H02K 7/006 |
| | | | 192/85.61 |
| 2014/0132378 A1* | 5/2014 | Vafakhah | H01F 27/12 |
| | | | 336/55 |
| 2014/0166075 A1* | 6/2014 | Koppikar | H02S 40/425 |
| | | | 136/246 |
| 2015/0145112 A1* | 5/2015 | Otremba | H01L 23/49541 |
| | | | 257/676 |
| 2016/0041452 A1 | 2/2016 | Nomura et al. | |
| 2016/0118317 A1* | 4/2016 | Shedd | F25B 23/006 |
| | | | 257/712 |
| 2017/0125321 A1* | 5/2017 | Manninen | H01L 21/4882 |
| 2017/0290205 A1* | 10/2017 | Shepard | H05K 7/203 |
| 2018/0102306 A1* | 4/2018 | Cho | H01L 21/565 |

\* cited by examiner

INTEGRATED PCU AND GPU COOLING SYSTEM

FIELD OF THE DISCLOSURE

This specification relates generally to an integrated cooling system configured to provide simultaneous cooling to an electronics control system for an electrified vehicle. More particularly, this application relates to improvements related to heat generation and dissipation in electronics control systems that use both Power Control Unit (PCU) and Graphics Processing Unit (GPU) devices in autonomous vehicles.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Autonomous vehicle development has progressed rapidly over the last few years due to the demand for decreased human control while driving. The model for advanced powertrain control and electronics systems is based off of current hybrid electric and electric vehicle systems. This includes, for example, an auxiliary DC-DC converter and Power Control Unit (PCU), wherein the PCU includes an inverter, generator, boost converter, motor control unit, gate drive, passive components, and an associated active liquid cooling system. In addition, a Graphics Processing Unit (GPU) is used to process sensor and image data gathered to help the vehicle navigate surrounding obstacles. Heat generation from these disparate components can demand efficient cooling systems to maintain a suitable environment for optimal operation of the assembly. For example, one current solution includes passive or active air cooling of the GPU separately in a different vehicle compartment, for example the trunk. While this may be sufficient for a single prototype part or vehicle, a more comprehensive/integrated cooling solution is needed when all aforementioned parts are packaged together in a compact housing and installed in a confined harsh environment with elevated temperatures, for example the engine compartment.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to various aspects of the disclosed subject matter, an electronics control system is presented including a power control unit disposed above a graphics processing unit and thermally connected to a cooling assembly. Further, a GPU is disposed within the housing, below the power control unit and thermally connected to the cooling assembly, an auxiliary DC-DC converter is disposed below the power control unit and thermally connected to the cooling assembly, and a cooling assembly is disposed at a predetermined location and configured to simultaneously transfer heat away from a power control unit, graphics processing unit, and auxiliary DC-DC converter via fluid circulation.

BRIEF DESCRIPTION OF THE DRAWINGS

A more complete appreciation of the disclosed embodiments and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details.

It is to be understood that terms such as "top," "bottom," "side," and the like that may be used herein merely describe points of reference and do not necessarily limit embodiments of the present disclosure to any particular orientation or configuration.

Autonomous vehicles may require even more advanced equipment (e.g., relative to hybrid electric and electric vehicles) to process the increased amount of data, such as images and sensor data of the vehicle's surroundings. In response to the necessary processing power required for safe and reliable analysis of images, sensor data, and other driving variables, autonomous vehicles supplement analysis using, for example, a Graphics Processing Unit (GPU). When used in conjunction with cameras and different sensors, such as radar, ultrasonic, Lidar, etc.; a GPU can digitally map the immediate course ahead and help facilitate navigation around obstacles that are motionless or moving. The PCU provides for power conversion between a DC terminal (e.g. battery) and AC terminal (e.g. motor and/or generator) in an electrified vehicle. The PCU is typically used in both motoring and power regeneration.

Each of these devices (e.g., sensors, PCU, GPU, etc.) on their own radiate heat and may be passively cooled when space is not an issue. However, when used and packaged together in confined harsh environments such as in autonomous vehicles, the amount of generated heat in the confined space can require active cooling in order to keep electronic devices within maximum allowable temperatures. Moreover, as processing technology develops further, device packaging will remain relatively the same size or become smaller, which may result in an increase in chip and circuitry density which may further increase the power density from a single or multiple devices. Thus, a compact and effective integrated cooling system can provide effective cooling for these advanced electronics systems.

Figure 1:
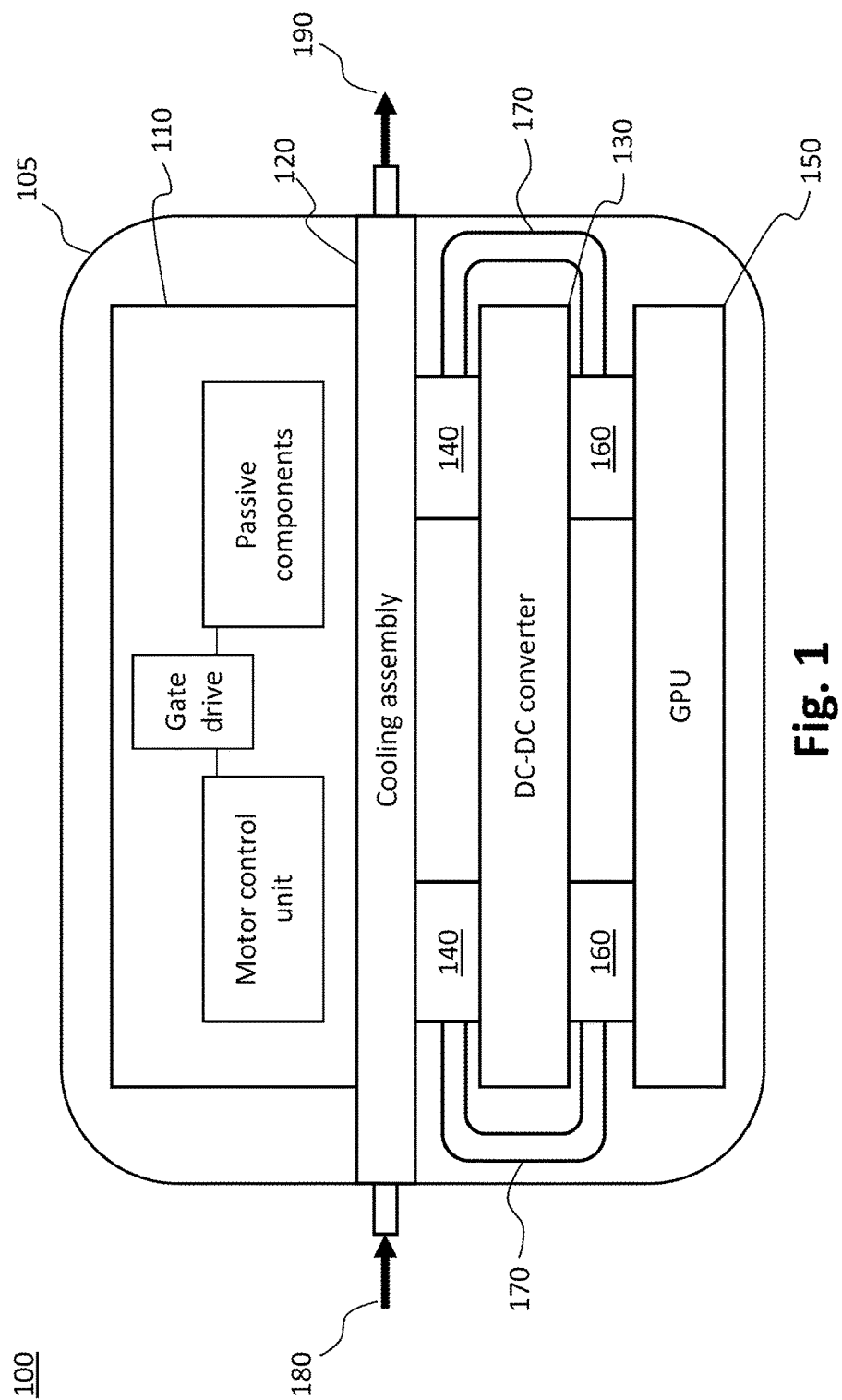
FIG. 1 is a cross-sectional diagram of a PCU and GPU system where the cooling system is disposed between and thermally coupled to the PCU and auxiliary DC-DC converter, and the GPU is disposed adjacent to the auxiliary DC-DC converter but thermally coupled to both the heat sinks and cooling assembly via a thermal transfer structure according to one or more aspects of the disclosed subject matter.

The present disclosure relates to an integrated cooling system for an electronics control system that uses both PCU and GPU devices, and can also contain an auxiliary DC-DC converter. In FIG. 1, the PCU of an automobile, for example a hybrid electric vehicle, includes multiple components combined that monitor and control power from the battery to the vehicle electric motor(s) and electronics system. The PCU can include, for example, a voltage-boosting converter, an inverter, semiconductor switches, and other passive components. An electronics control system can also be packaged with an auxiliary DC-DC converter that is used to convert the high voltage from the vehicle battery to a lower voltage, for example, 12 volts required for auxiliary equipment. Autonomous vehicles require an additional device, the GPU, to process the increased amount of real-time data generated from cameras and sensors regarding the vehicle's surroundings.

Active cooling systems can be implemented due to the amount of heat generated by electronics control system elements during regular use. As more cameras and sensors are added to vehicles, such as autonomous vehicles, the increase in the amount of image data received and analyzed by the GPU can increase the required graphics processing power of the GPU which, in turn, may cause the SPU to generate more heat. Currently, GPUs are located in a separate vehicle compartment, such as the trunk, where a cool air duct is used to supply air flow to the GPUs for cooling. In most forms of active cooling, a fan is added to increase circulation to heat sink components, but the entire cooling system can be bulky, noisy, and prone to fouling due to dust contamination or moisture ingression. When more devices are packaged together in order to save space, alternative methods and systems for cooling PCUs, GPUs, and other important equipment, such as the auxiliary DC-DC converter, can be implemented to handle the increased heat generated in a compact harsh environment.

An exemplary electronics control system 100 includes a PCU 110, a GPU 150, and an auxiliary DC-DC converter 130 packaged together in a layered arrangement with a cooling assembly 120. The electronics control system 100 and the cooling assembly 120 can be enclosed in a housing 105 to protect the components from the surrounding environment. As illustrated in FIG. 1, the PCU 110 can be disposed on top of the cooling assembly 120 and thermally connected to the cooling assembly 120 via a thermal interface material or bonding material that allows for thermal conductance of heat from the PCU elements to the cooling assembly 120. Another component that generates heat, the auxiliary DC-DC converter 130, can be disposed between the cooling assembly 120 and the GPU 150. The auxiliary DC-DC converter 130 can be separated from the cooling assembly 120 by a plurality of thermal spacers or standoffs 140.

Non-limiting examples of appropriate materials for the thermal spacer 140 include aluminum and copper, or other metals and non-metals with sufficient heat conductance. The auxiliary DC-DC converter 130 can be thermally connected to the plurality of thermal spacers 140, and the thermal spacers 140 can be thermally connected to the cooling assembly 120, which would allow three-dimensional heat transfer from the auxiliary DC-DC converter 130 through the thermal spacer 140 to the cooling assembly 120. Another component that generates heat, the GPU 150, can be disposed below the auxiliary DC-DC converter 130. The GPU 150 can be separated from the auxiliary DC-DC converter 130 by a plurality of heat sinks 160. The heat sinks 160 can act as a thermal spacer or allow for additional cooling via convective cooling from the heat sink 160 to the air.

Non-limiting examples of appropriate materials for the heat sink 160 include aluminum and copper, or other metals and non-metals with sufficient heat conductance. The GPU 150 can be thermally connected to the plurality of heat sinks 160, and the heat sinks 160 can be thermally connected to the auxiliary DC-DC converter 130, which would allow heat transfer from the GPU 150 through the heat sink 160, GPU 150, and thermal spacers 140 to the cooling, assembly 120. The plurality of heat sinks 160 disposed between the auxiliary DC-DC converter 130 and the GPU 150 can be thermally connected to the thermal spacers disposed between the cooling assembly 120 and auxiliary DC-DC converter 130 via a thermal transfer structure 170, such as a heat pipe.

Non-limiting examples of appropriate materials for the thermal transfer structure 170 include aluminum and copper, or other metals and non-metals with sufficient heat conductance. The thermal transfer structure 170 can also be a hollow heat pipe that includes a porous metal or ceramic wick that is partially filled with a thermally conductive fluid, such as water, ethanol, or another fluid optimal for two-phase heat transfer. In this manner, the thermal transfer structure 170 would help reduce the conductance of heat from the GPU 150 through the auxiliary DC-DC converter 130. Instead, some amount of heat would flow from the GPU 150 to the heat sinks 160 to the thermal transfer structure 170 to the thermal spacer 140 where it is absorbed by the cooling assembly 120. Note that the thermal transfer structure 170 can also be directly connected to the cooling assembly 120, thus bypassing the thermal spacer 140. The arrow 180 demonstrates where coolant liquid, for example water, can be circulated into the cooling assembly by a pump (not shown) in order to absorb heat generated from the electronics control system via convective heat transfer and carried to the coolant output, represented by arrow 190.

The cooling assembly can be a serpentine channel that is machined cast or molded into the housing 105 in a predetermined pattern in order to contact all the components at locations where the most heat is generated. The heated fluid can be directed from the coolant output 190 to a feature that cools the liquid for example a radiator (not shown), and cooled before being circulated back in through the coolant input 180. Instead of finning through just one layer, for example the layer between the PCU 110 and the auxiliary DC-DC converter 130, the cooling assembly can also be extended to fluidly couple multiple layers. For example, after flowing between the PCU 110 and auxiliary DC-DC converter 130. The cooling assembly 120 can be routed to below the GPU 150 where the GPU 150 could be directly thermally connected to the cooling assembly 120 via a thermal interface material or separated from the extended cooling assembly 120 by a gap via an additional plurality of thermal spacers similar to 140. This extension would allow for direct heat transfer from the GPU 150 to the cooling assembly 120 and reduce heat transferred around the auxiliary DC-DC converter 130 from the GPU 150. This cooling assembly 120 extension can be repeated as required if more layers of devices are added.

Figure 2:
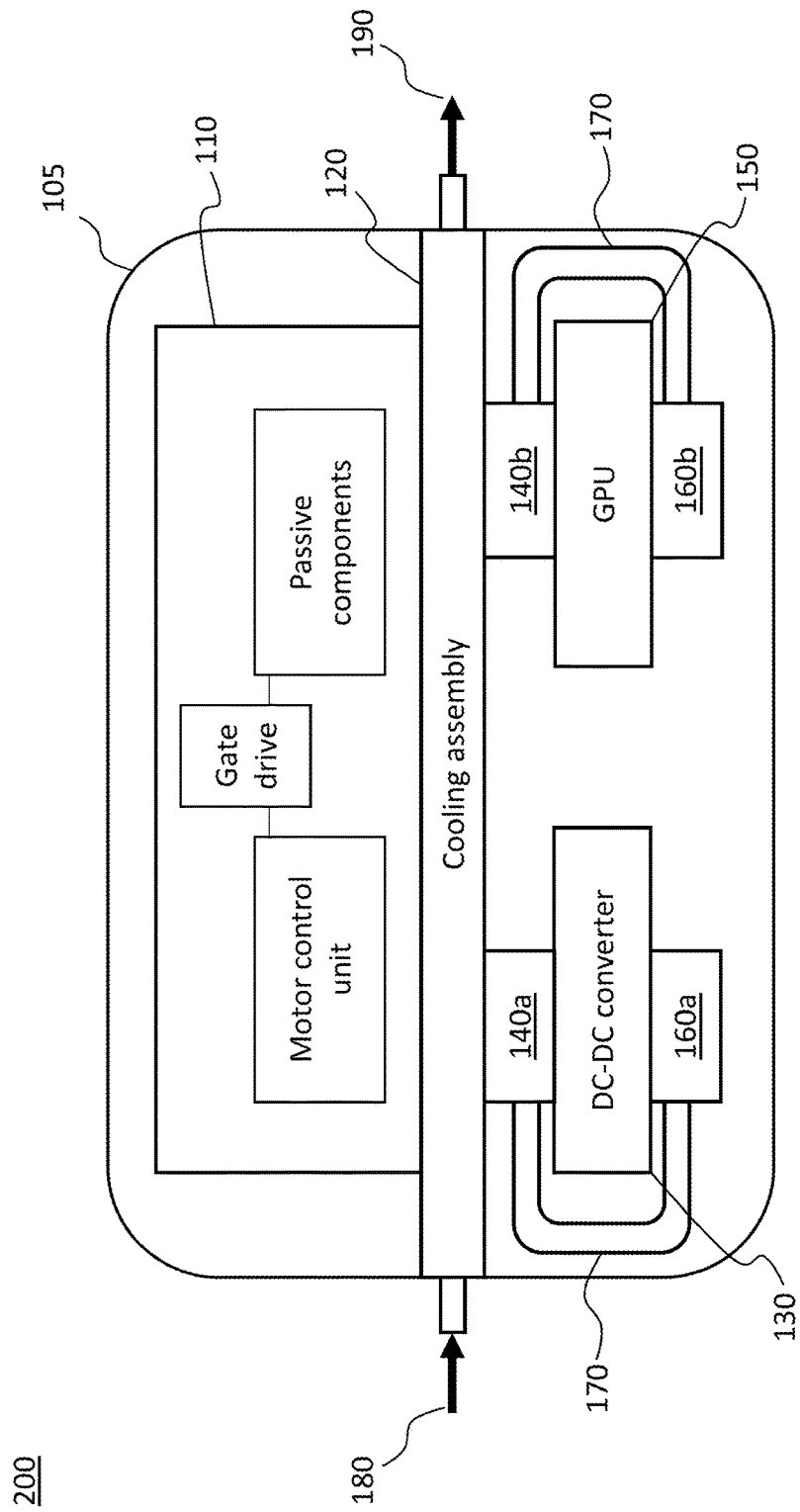
FIG. 2 is a cross-sectional diagram of a PCU and GPU system where the cooling system is disposed between and thermally coupled to the PCU, auxiliary DC-DC converter, as well as the GPU according to one or more aspects of the disclosed subject matter.

According to an alternative arrangement, the PCU 110, GPU 150, and auxiliary DC-DC converter 130 are both in direct thermal connection with the cooling assembly 120 in a housing 105 to protect the components. As shown in FIGS. 1 and 2, the PCU 110 is disposed on top of the cooling assembly 120 and thermally connected to the cooling assembly 120 via a thermal interface material that allows for thermal conductance of heat from the PCU elements to the cooling assembly 120.

However, as illustrated in FIG. 2, the auxiliary DC-DC converter 130 and GPU 150 can both be disposed below the cooling assembly 120, and separated from the cooling assembly 120 by thermal spacers 140*a*, 140*b*.

The auxiliary DC-DC converter 130 is thermally connected to a first thermal spacer 140*a* on a first face that is facing towards the cooling assembly 120, and the first thermal spacer 140*a* is thermally connected to the cooling assembly 120, allowing heat transfer from the auxiliary DC-DC converter 130 through the first thermal spacer 140*a* to the cooling assembly 120. Additionally, a first heat sink 160*a* can be thermally connected to the auxiliary DC-DC converter 130 on a second face that is facing away from the cooling assembly 120. The first heat sink 160*a* can be thermally connected to the first thermal spacer 140*a* via thermal transfer structure 170 such as a heat pipe, composite heat conductor, or solid material heat conductor.

The GPU 150 can be disposed adjacent to the auxiliary DC-DC converter 130 on the cooling assembly 120. The GPU 150 can be thermally connected to a second thermal spacer 140*b* on a first face that is facing towards the cooling assembly 120, and the second thermal spacer 140*b* is thermally connected to the cooling assembly 120, allowing heat transfer from the GPU 150 through the second thermal spacer 140*b* to the cooling assembly 120. Additionally, a second heat sink 160*b* can be thermally connected to the GPU 150 on a second face that is facing away from the cooling assembly 120. The second heat sink 160*b* can be thermally connected to the second thermal spacer 140*b* via thermal transfer structure 170 such as a heat pipe composite heat conductor, or solid material heat conductor.

The thermal transfer structures 170 would help conduct heat from the bottom side of the auxiliary DC-DC converter 130 and GPU 150 via the heat sinks 160*a*, 160*b* to the thermal spacers 140*a*, 140*b* where it is absorbed by the cooling assembly 120. Again, note that the thermal transfer structures 170 can also be directly connected to the cooling assembly 120, thus bypassing the thermal spacers 140. As discussed with regard to FIG. 1, the arrow 180 demonstrates where coolant liquid, for example water, can be circulated into the cooling assembly by a pump (not shown) in order to absorb heat generated from the electronics control system via convective heat transfer and carried to the coolant output, represented by arrow 190.

The cooling assembly can be a serpentine channel that is machined, cast, or molded into the housing 105 in a predetermined pattern in order to contact all the components at locations where the most heat is generated. The heated fluid can be directed from the coolant output 190 to a feature that cools the liquid, for example a radiator (not shown), and cooled before being circulated back in through the coolant input 180.

Figure 3:
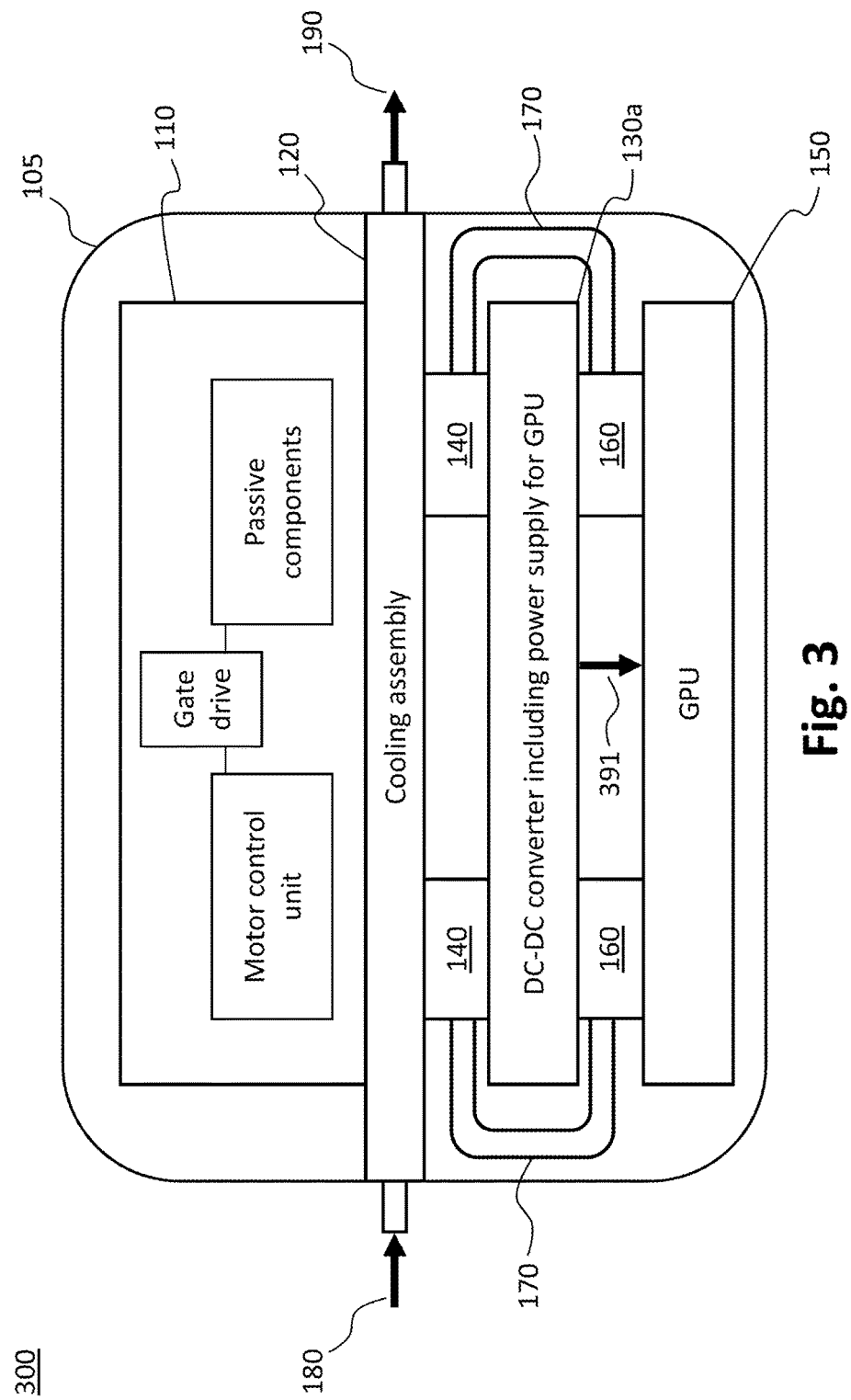
FIG. 3 is a cross-sectional diagram of a PCU and GPU system where the cooling system is disposed between and thermally coupled to the PCU, auxiliary DC-DC converter, as well as the GPU, and the auxiliary DC-DC converter also acts as the power supply for the GPU according to one or more aspects of the disclosed subject matter.
Figure 4:
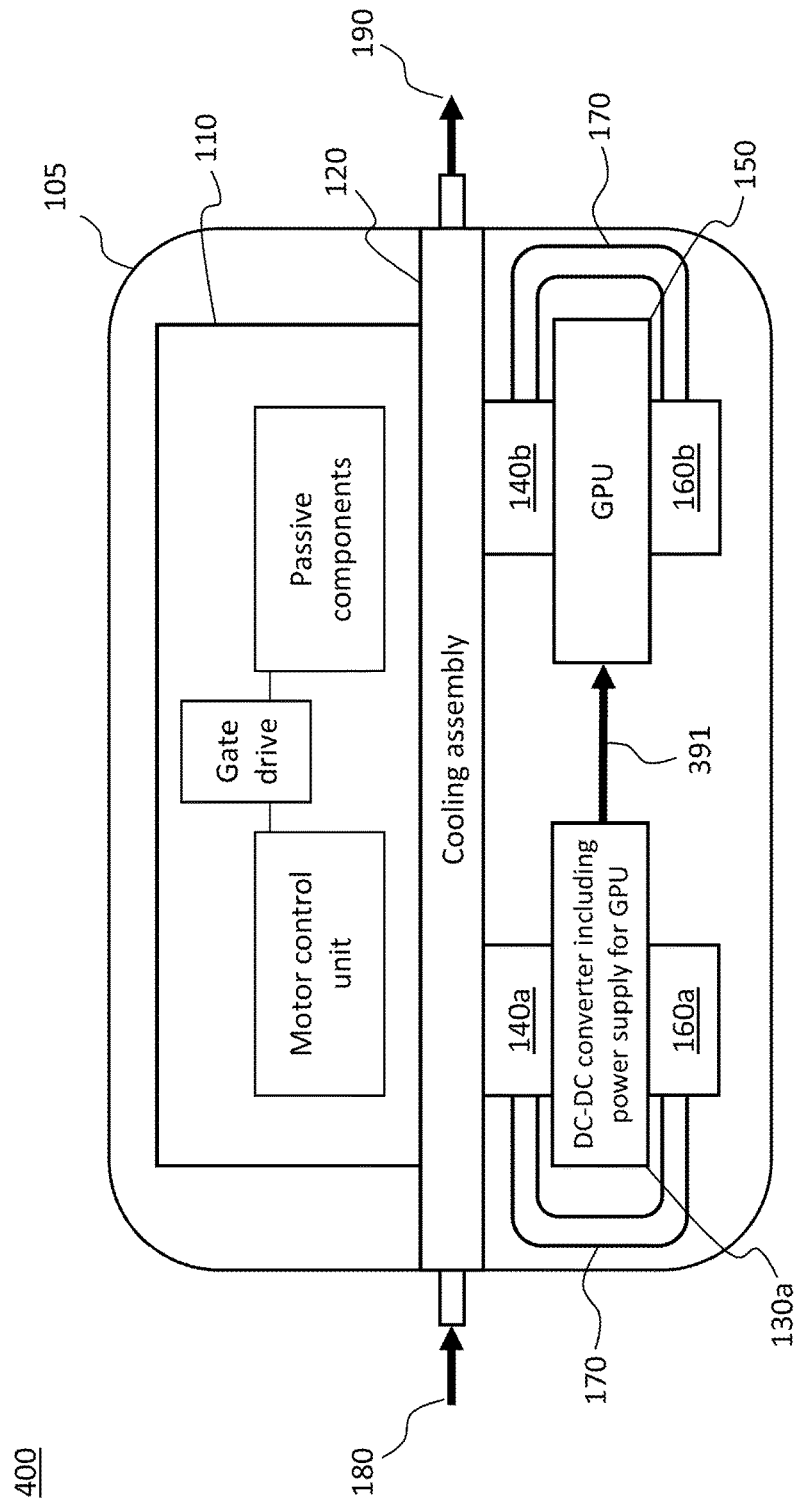
FIG. 4 is a cross-sectional diagram of a PCU and GPU system where the cooling system is disposed between and thermally coupled to the PCU, auxiliary DC-DC converter, as well as the GPU, and the auxiliary DC-DC converter also acts as the power supply for the GPU according to one or more aspects of the disclosed subject matter.

According to alternative aspects of the disclosure, the GPU 150 may not have its own power source and can be powered by the auxiliary DC-DC converter 130*a*. In this case, as shown in FIG. 3 and FIG. 4, the GPU 150 can be electronically connected 391 to the auxiliary DC-DC converter 130*a* allowing the auxiliary DC-DC converter 130*a* to convert (e.g. step down) the voltage from the battery (not shown) and power the GPU 150. The auxiliary DC-DC converter 130*a* can be designed to provide various voltage levels to the GPU 150. Regardless, this configuration decreases the overall heat generation of the GPU 150 and thus shifts heat away from the GPU 150 towards the auxiliary DC-DC converter 130*a*. The remainder of the components in FIG. 3 are arranged to function as described with regard to FIG. 1.

FIG. 4 is the same as FIG. 2 with the exception that the GPU 150 is electronically connected 391 to the auxiliary DC-DC converter 130*a* allowing the auxiliary DC-DC converter 130*a* to convert (e.g. step down) the voltage from the battery (not shown) and power the GPU 150, which does not contain its own power source in this embodiment. As with FIG. 3, this configuration decreases the overall heat generation of the GPU 150 and thus shifts heat away from the GPU 150 towards the auxiliary DC-DC converter 130*a*.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another, or may be combined in various ways. All possible combinations and sub-combinations are intended to fall within the scope of this disclosure.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosure. The accompanying claims and their equivalents are intended to cover such forms or modifications as would fall within the scope and spirit of the present disclosure.

What is claimed is:

1. An electronics control system, comprising:
   a cooling assembly;
   a power controller thermally connected to a first side of the cooling assembly via a thermal interface material;
   a processor thermally connected to a second side of the cooling assembly opposite the first side, the processor and the power controller are separated by at least one thermal spacer; and
   an auxiliary DC-DC converter thermally connected to each of the cooling assembly and the processor, and the auxiliary DC-DC converter disposed between the cooling assembly and the processor, wherein the cooling assembly is to simultaneously transfer heat away from the power controller and the processor, and the auxiliary DC-DC converter and the cooling assembly are separated by the at least one thermal spacer, and the auxiliary DC-DC converter and the processor are separated by at least one heat sink thermally connected to the processor.

2. The electronics control system of claim 1, further comprising:

a thermal transfer structure connecting the at least one heat sink and the at least one thermal spacer.

3. The electronics control system of claim 2, wherein the processor is a graphical processor.

4. The electronics control system of claim 1, wherein the processor is not independently powered.

5. The electronics control system of claim 1, wherein the auxiliary DC-DC converter powers the processor.

6. The electronics control system of claim 1, wherein the cooling assembly is to simultaneously cool the power controller, the processor, and the auxiliary DC-DC converter.

7. The electronics control system of claim 1, wherein the processor is a graphical processor.

8. The electronics control system of claim 1, further comprising:

a housing that houses the cooling assembly, the power controller, the processor, and the auxiliary DC-DC converter.

* * * * *